United States Patent
Wiseman et al.

(10) Patent No.: US 7,219,802 B2
(45) Date of Patent: May 22, 2007

(54) THIN WAFER INSERT

(75) Inventors: Brian Wiseman, Glencoe, MN (US);
Michael Peterson, Victoria, MN (US);
Tony Simpson, Savage, MN (US)

(73) Assignee: Entegris, Inc., Chaska, MN (US)

( * ) Notice: Subject to any disclaimer, the term of this patent is extended or adjusted under 35 U.S.C. 154(b) by 565 days.

(21) Appl. No.: 10/478,587

(22) PCT Filed: Mar. 28, 2002

(86) PCT No.: PCT/US02/09423

§ 371 (c)(1),
(2), (4) Date: Nov. 24, 2003

(87) PCT Pub. No.: WO02/079053

PCT Pub. Date: Oct. 10, 2002

(65) Prior Publication Data
US 2004/0188320 A1    Sep. 30, 2004

Related U.S. Application Data

(60) Provisional application No. 60/280,774, filed on Apr. 1, 2001.

(51) Int. Cl.
*B65D 85/00* (2006.01)

(52) U.S. Cl. .................. 206/710; 206/454; 206/832; 211/41.18

(58) Field of Classification Search ............... 206/710, 206/711, 723, 832, 454; 211/41.18, 40, 41.1
See application file for complete search history.

(56) References Cited

U.S. PATENT DOCUMENTS

| | | | |
|---|---|---|---|
| 5,097,946 A * | 3/1992 | Emrich | 206/745 |
| 5,310,339 A * | 5/1994 | Ushikawa | 432/253 |
| 5,346,518 A | 9/1994 | Baseman et al. | |
| 5,472,099 A | 12/1995 | Terashima | |
| 5,553,711 A | 9/1996 | Lin et al. | |
| 5,634,563 A * | 6/1997 | Peng | 211/40 |
| 5,788,088 A * | 8/1998 | Kao | 211/40 |
| 5,833,062 A * | 11/1998 | Yeh | 206/307.1 |
| 5,890,598 A | 4/1999 | Hayashida et al. | |
| 6,099,302 A | 8/2000 | Hong et al. | |
| 6,287,112 B1 * | 9/2001 | Van Voorst Vader et al. | 432/258 |

* cited by examiner

*Primary Examiner*—Jila M. Mohandesi
(74) *Attorney, Agent, or Firm*—Patterson, Thunete, Skaar & Christensen, P.A.

(57) ABSTRACT

A plastic insert (20) is configured to provide support of thin wafers (49) in wafer carriers (45) configured to provide peripheral wafer support. The invention includes the insert, the insert in combination with a wafer carrier, and the, methods of supporting the thin wafers as provided by the insert and the wafer carrier. The insert (20), in preferred embodiments, utilize tabs (80, 82) that fit into the side wall recesses (53) and have an interference fit in said recesses to secure the insert in place.

11 Claims, 5 Drawing Sheets

THIN WAFER INSERT

This application claims the benefit under 35 U.S.C 119(e) of U.S. Provisional Application No. 60/280,774, filed on Apr. 1, 2001. Said application is incorporated herein by reference.

FIELD OF THE INVENTION

This invention relates to wafer carriers, more particularly the invention relates to apparatus and methods for thin wafers.

BACKGROUND OF THE INVENTION

Integrated circuits are manufactured from crystalline wafers, typically silicon wafers. These wafers are subjected to numerous processing steps in highly controlled environmental conditions. The wafers are extremely fragile and vulnerable to damage and contamination. The wafers are typically round in shape and are transported, stored, and processed in wafer carriers of various types. Wafer carriers are typically formed of plastic and will generally have a machine interface that provides precise positioning of the wafer carrier on equipment. A common wafer carrier utilized in semiconductor fabrication facilities is the H-bar wafer carrier. This carrier has an open front, or top depending on the orientation, a pair of sidewalls, and a pair of endwalls. One of the endwalls has an H-bar machine interface. Wafers are inserted and withdrawn through the open front from a plurality of slots defined by recesses on the inside of the carrier sidewalls. The recesses are defined by projections extending generally toward the opposite sidewall. The projections may be configured as teeth. For conventional wafers the carriers typically support and restrain the wafers at their peripheral edges.

Conventional wafers are 0.030 inches thick. As industry has striven to make electronic devices smaller, integrated circuits have become denser, smaller, and thinner. Integrated circuits are now being manufactured from thin wafers having a thickness of 0.007 in.

Robotic means are generally utilized for handling and processing of the individual silicon wafers into the integrated circuit chips including the insertion and withdrawal of the wafers from carriers. Intermediate processing steps the wafers are typically supported in H-bar wafer carriers and individual wafers are withdrawn and inserted by transfer equipment with robotic arms. The set up of the transfer equipment is highly critical so that the wafers are properly grasped and not damaged during any such transfers. To the extent possible, for economic reasons, it is desirable to utilize the same processing equipment and the same set up for the transfer equipment, when then wafers are utilized as opposed to be conventional wafers.

Generally semiconductor fabrication facilities are now being set up for 200 or 300 mm wafers. In that the thin wafers are substantially more fragile and less rigid than the conventional wafers, when such wafers are peripherally supported in conventional wafer carriers, the wafers bow downwardly in the middle of the wafer due into gravity. This requires modification of the wafer transfer equipment to accommodate said bowing and prevent damage to the wafer. It would be desirable to be able to utilize conventional wafer carriers such as H-bar wafer carriers and not have to reconfigure the transfer equipment when thin wafers are being processed

SUMMARY OF THE INVENTION

A plastic insert is configured to provide support of thin wafers in wafer carriers configured to provide peripheral wafer support. The invention includes the insert, the insert in combination with a wafer carrier, and the methods of supporting the thin wafers as provided by the insert and the wafer carrier. The inserts, in preferred embodiments, utilize tabs that fit into recesses formed in the side of a carrier and have a frictional fit in said recesses to secure the insert in place. In preferred embodiments the inserts have a top surface with a plurality of wafer supports positioned inwardly from the wafer periphery for supporting the wafers with minimal contact. In preferred embodiments the insert has a lower surface having strengthening structure providing rigidity to the insert. The top surface ribs may preferably be oriented parallel to the insertion and withdrawal direction of the wafers and extend upwardly to position the supported wafer in the slot immediately above the slot defined by the recesses in which the tabs are positioned. Thus, the inserts may be inserted into alternate slots in the carrier. The insert, in preferred embodiments may have an h-shape offering an optimal combination of support of each wafer and precise positioning of the wafer while minimizing the amount of plastic and correspondingly the weight of the insert.

Thus, the invention may be characterized as a wafer carrier and insert for supporting at least one thin wafer therein. The wafer carrier has a carrier portion having at least a top, a bottom, a pair of opposing sides, and an open front. The pair of opposing sides has a plurality of opposing ribs defining a plurality of slots. The insert is adapted to fit one of the slots and comprises a plate. The plate has a pair of side margins with a plurality of projecting tab structures that are adapted to frictionally engage the surfaces within the recess forming the slot. The plate has a plurality of wafer supports projecting upwardly which are adapted to support a thin wafer above the insert with a portion of the periphery of the wafer within the slot immediately above the slot in which the insert is located. The wafer supports may be configured so that a robotic wafer handling member is insertable between said insert and the wafer. The insert may have a bottom surface with stiffening ribs formed therein. Each of the tab structures may be spring biased against the surface engaged by the tab, and the direction of the bias may alternate between adjacent tabs. In addition, the wafer supports may project into the slot wherein the wafer is held for a distance of at least half of the height of the slot so that back-and-forth movement of the wafer within the slot is minimized when the wafer carrier is oriented with the open front of the carrier upward.

The invention may also be characterized as a wafer carrier and insert for supporting at least one thin wafer therein, and wherein the insert is a plate having means for engaging the opposing sides of the carrier so that the plate is supported intermediate the opposing sides. The plate has means for supporting a thin wafer above the top surface of the plate, which may be adapted so as to allow a robotic wafer handling member to be interposed between the insert and a thin wafer resting on the wafer supports.

The invention may also be characterized as an insert for supporting a thin wafer in a wafer carrier. The wafer carrier has an open front with an insertion and withdrawal direction, a pair of sidewalls, a top and a bottom. The sidewalls have a plurality of recess pairs defining a plurality of slots, and the bottom has an interference fit for precise positioning of the carrier with respect to a corresponding receiver. The insert has a pair of recess engaging portions that are configured to engage a recess pair of the wafer carrier. Further, the insert has an upper surface with a plurality of upwardly extending protrusions to provide contact with a wafer.

The invention may also be characterized as a method for supporting at least one thin wafer in a wafer carrier. The method has the steps of providing a wafer carrier having at least a top, a bottom, a pair of opposing sides, and an open front, the pair of opposing sides having a plurality of opposing recesses defining a plurality of slots; forming a planar insert having a top surface, the insert being adapted to fit in one of said plurality of slots and having wafer supports for supporting a thin wafer above said top surface with a portion of the periphery of the wafer within a separate one of said plurality of slots; placing said insert in one of said plurality of slots; and resting a thin wafer on the wafer supports of said insert.

A feature and advantage of particular embodiments of the invention is that the inserts may be securely attached in the wafer carrier by utilizing the tabs as integral retainer springs. The tabs may alternate with one bearing against the respective upward projection and the next bearing against the respective lower projection. The row of tabs preferably extends substantially the length of each recess. The alternating tabs and the extension of the tabs the length of each of the respective recesses, provides a precise positioning means for the insert with respect to the carrier thereby precisely positioning the supported wafer.

A feature and advantage of the invention is that thin wafers of approximately 0.007 inches in thickness may be supported in conventional wafer carriers.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF PREFERRED EMBODIMENTS

The accompanying Figures depict embodiments of the wafer container of the present invention, and features and components thereof. Any references to front and back, right and left, top and bottom, upper and lower, and horizontal and vertical are intended for convenience of description, not to limit the present invention or its components to any one positional or spacial orientation. Any dimensions specified in the attached Figures and this specification may vary with a potential design and the intended use of an embodiment of the invention without departing from the scope of the invention.

Figure 1:
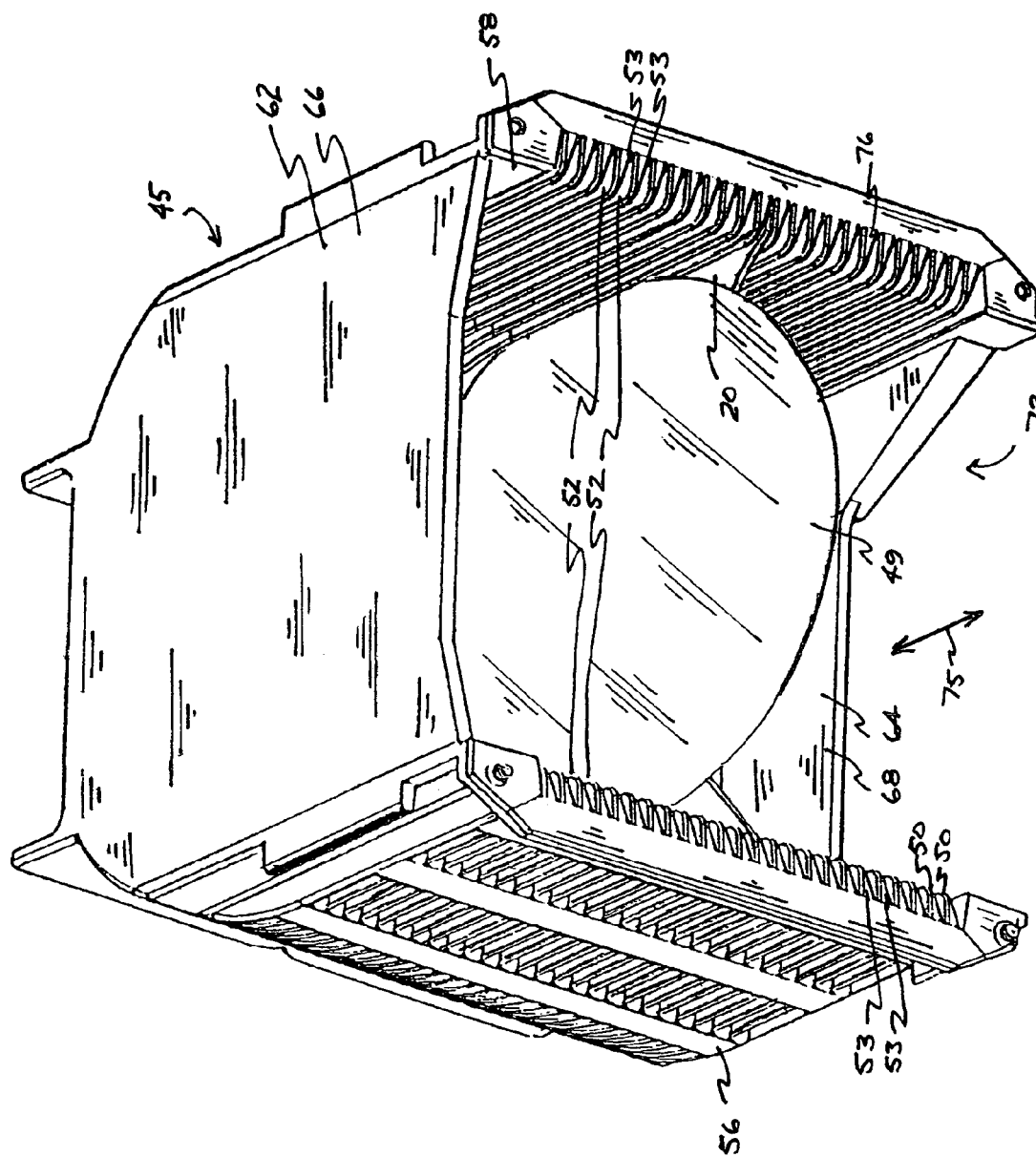
FIG. 1 is a perspective view of a wafer carrier and insert in accordance with the present invention.

Referring now to FIG. 1, an H-bar wafer carrier 45 and insert 20 in accordance with the present invention is shown supporting a thin wafer 49. The wafer carrier has a plurality of ribs 50 defining pairs 52 of recesses 53, with one of the pair of recesses on the left side 56 and the corresponding other recess on a right side 58. The H-bar wafer carrier also has a pair of ends 62 and 64, which, when the carrier is oriented as shown in FIG. 1, constitute a top 66 and a bottom 68. Top 66, bottom 68, left side 56 and right side 58 define an open front 72 for insertion and removal of wafers in a direction indicated by the double arrow 75. Each recess pair defines a wafer slot 76 and is configured to receive a wafer from the open front. Bottom 68 may be interference fit In FIGS. 2 and 3, a currently most preferred embodiment of an insert in accordance with the invention is shown. Insert 20 is generally planar and has a top surface 24, a bottom surface 26, and a pair of peripheral edges configured as recess engaging portions 30 and 32. The insert is generally H-shaped and has reinforcing structure 38 on the bottom side shaped as stiffening ribs 40 that generally follow the outline of the insert and extend in radial directions and in concentric arcs. This reinforcing structure provides stiffening to the insert. Top surface 24 has wafer supports 120, 122, 124 and 126, each projecting upwardly from ribs 44. Ribs 44 also provide stiffening to insert 20, and may serve as guides for a robotic wafer handling tool (not shown). Wafer supports 120, 122, 124 and 126, are disposed so that the wafer is supported at multiple points inward of the periphery of the wafer. It is currently most preferred that the wafer contact area of wafer supports 120, 122, 124, and 126 be minimized as shown so as to minimize friction and dragging against the wafer surface when a wafer is inserted and withdrawn from the carrier. Other embodiments having a larger contact area, however, such as is shown in FIG. 4, may also be used. The insert as illustrated is preferably injected molded of a rigid and resilient plastic such polycarbonate, but may be formed from any suitable and compatible material.

Figure 2:
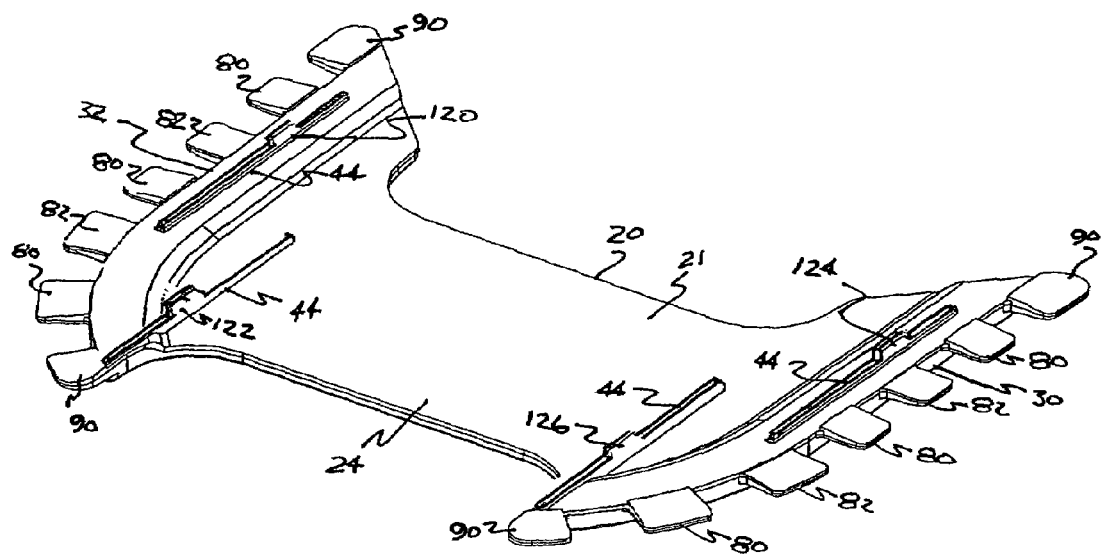
FIG. 2 is a perspective view of the top of a currently most preferred embodiment of an insert in accordance with the invention.
Figure 3:
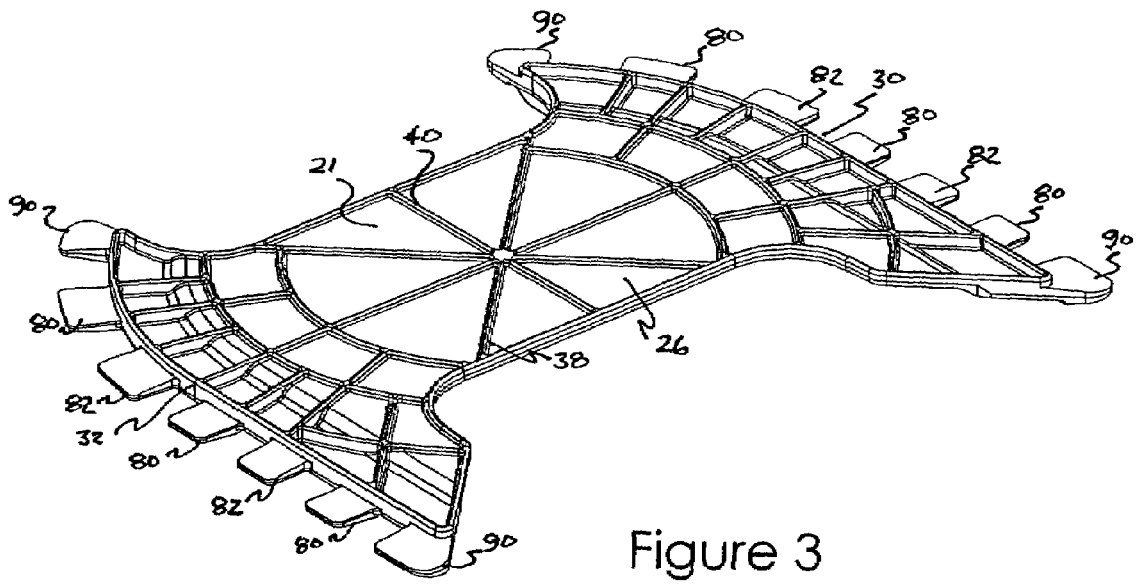
FIG. 3 is a perspective view of the bottom of an insert in accordance with the invention.
Figure 4:
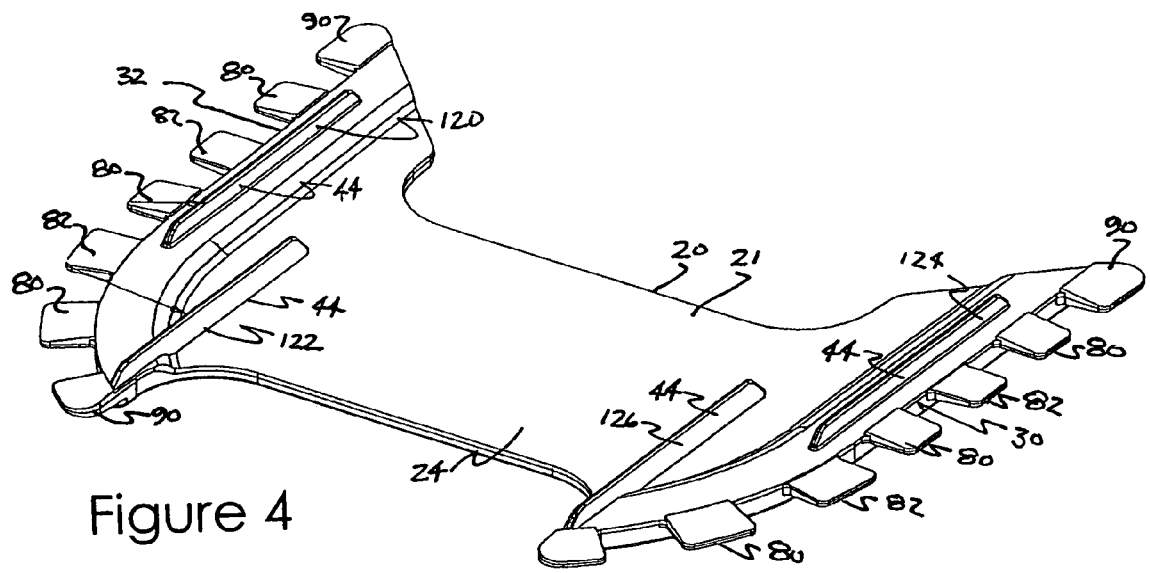
FIG. 4 is a perspective view of the top of another embodiment of an insert in accordance with the invention
Figure 5:
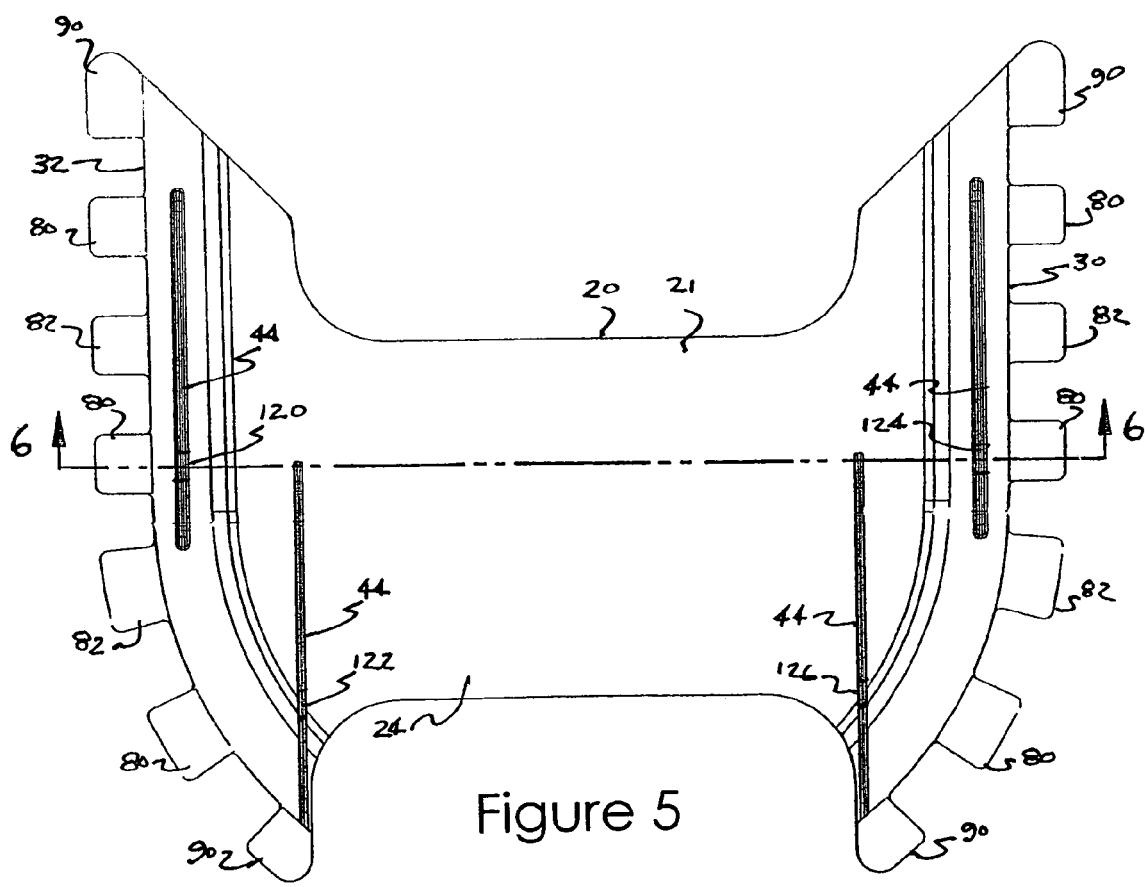
FIG. 5 is a top plan view of the insert of FIGS. 2 and 3.
Figure 6:
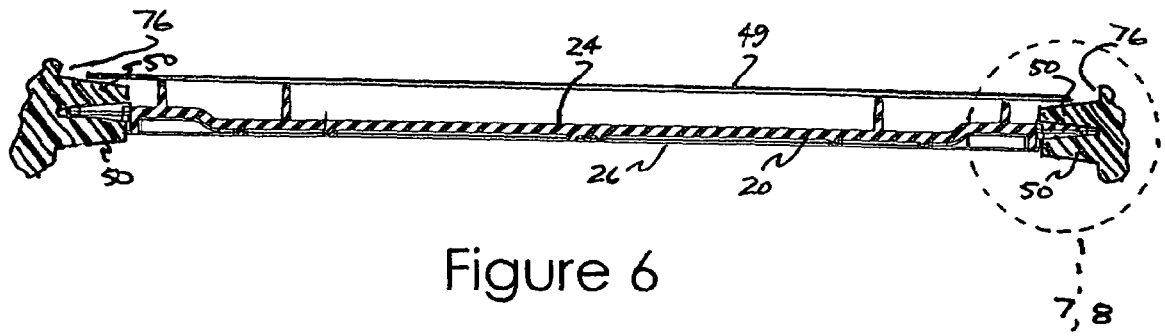
FIG. 6 is a front cross-sectional view of the insert of FIGS. 2, 3 and 5, shown inserted in a wafer carrier.
Figure 7:
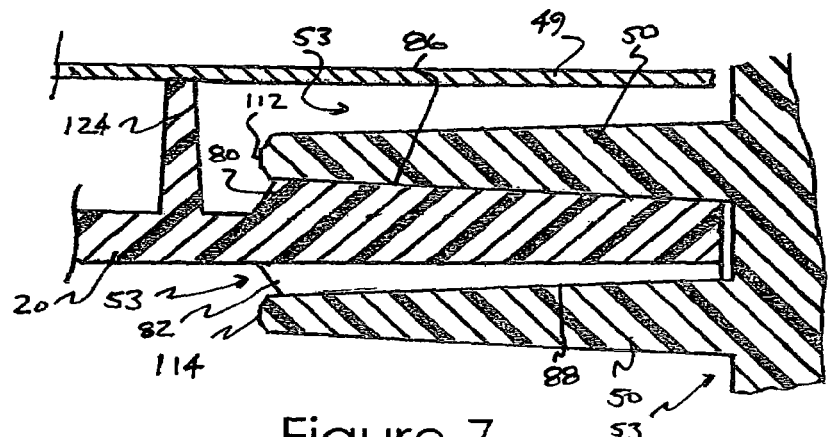
FIG. 7 is a cross-sectional view of a portion of the insert of FIGS. 2, 3, 5 and 6, and taken at line 6—6 of FIG. 5.

In the embodiment illustrated in FIGS. 2 and 3, recess engaging portions 30 and 32 are located at the side margins or plate 21 and have tab structures which alternate between a high tab 80 and a low tab 82. When installed in a wafer carrier, high tabs 80 are in frictional contact with a top surface 86 and low tabs 82 are in frictional contact with bottom surface 88 of recess 53 as best illustrated in FIGS. 6 and 7. High tabs 80 and low tabs 82 are placed so as to extend substantially the length of each recess 53. End tabs 90 have frictional surfaces on both the top and bottom. Also, high tabs 80 and low tabs 82 are configured so that when insert 20 is installed in the recesses 53 of a wafer carrier, high tabs 80 and low tabs 82 are slightly compressed so as to exert a biasing force toward the surface in recess 53 with which they are in contact. This spring bias serves to increase the amount of friction between high tabs 80 and low tabs 82 and the surfaces of recess 53, and assists in more firmly securing insert 20 within the wafer carrier while still allowing removal of the insert for cleaning purposes. The alternating direction of the biasing force between adjacent tabs serves to more accurately center insert 20 in recess 53.

Figure 9:
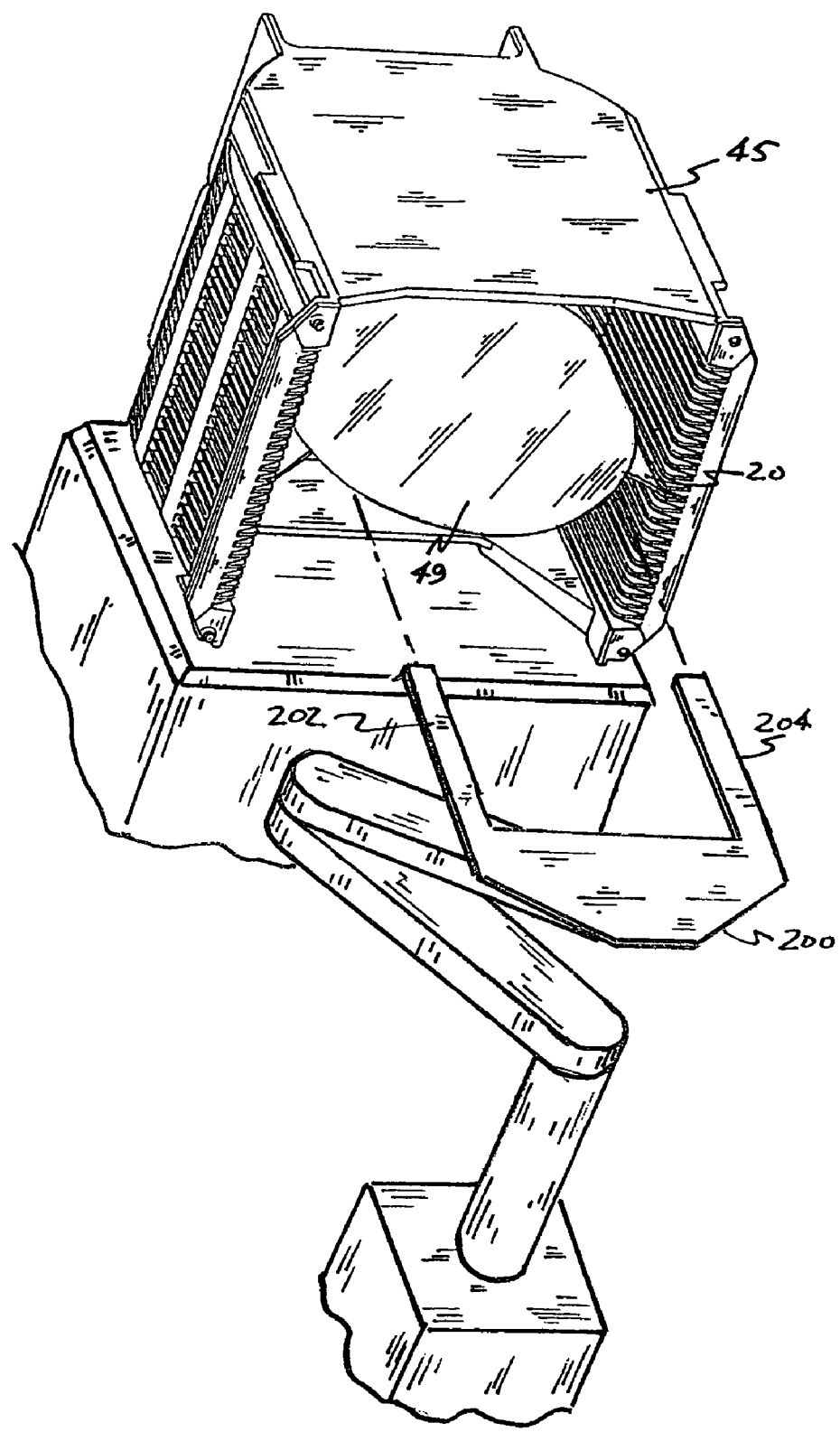
FIG. 9 is a perspective view of the wafer carrier and insert of the present invention in place on automatic processing equipment and with a robotic wafer handling arm assembly.

Referring now to FIGS. 1, 2, 6 and 7, it will be appreciated by those of skill in the art that the configuration of insert 20, and particularly the placement and configuration of wafer supports 120, 122, 124 and 126 provides certain unique features and advantages. The height of wafer supports 120, 122, 124 and 126 may be selected so as to allow a robotic wafer handling tool 200, such as is shown in FIG. 9, to be inserted between top surface 24 of insert 20 and wafer 49. It is preferred that the height of the wafer supports be selected so that a wafer 49 resting on the supports has a portion of its periphery within the slot 76 located immediately adjacent and above the slot in which insert 20 is located. Also, it is most preferred that the wafer supports 120, 122, 124 and 126 project into the immediately adjacent slot for at least one-half of the height of the slot, where the height of each slot is defined as the vertical distance between adjacent ends 112 and 114 of ribs 50. Such projection is preferred so that when wafer carrier 45 is oriented with open front 72 facing upward, a thin wafer 49 disposed in the immediately adjacent slot to the insert will be allowed a minimal amount of clearance for back-and-forth movement in the slot. Those of skill will of course recognize that when the height of wafer supports 120, 122, 124 and 126 is selected as described, a wafer carrier that is designed to carry 25 normal size wafers, will, with the maximum number of inserts positioned in every other slot, have a capacity of 12 thin wafers. In addition, those of skill will recognize that the placement of wafer supports 120, 122, 124 and 126 in the locations shown and with ribs 44 oriented front-to-back along the insert, allows the insert to be used with a variety of configurations of robotic wafer handling tools. For example, a forked tool 200 as shown in FIG. 9 may be inserted so that one branch 204 of the fork fits between wafer supports 120 and 122 and the other branch 202 of the fork fits between wafer supports 124 and 126. Alternatively, a robotic wafer handling tool having a single contact member may be inserted between wafer supports 122 and 126.

Figure 8:
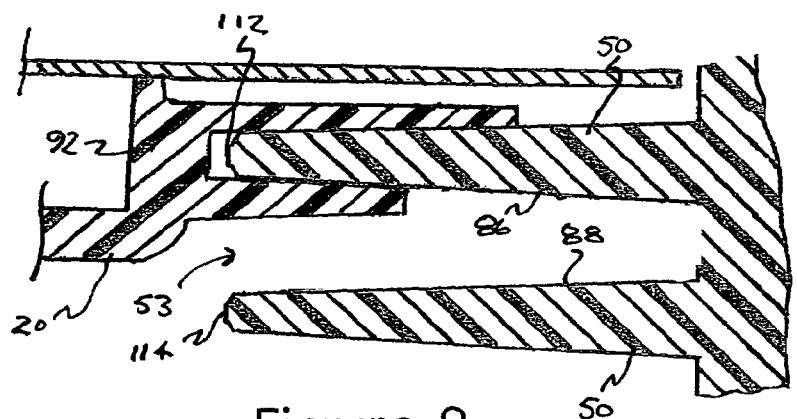
FIG. 8 is a cross-sectional view of a portion of an alternative embodiment of the insert of FIGS. 2, 3, 5 and 6, and taken at line 6—6 of FIG. 5.

Another embodiment of an insert according to the present invention is shown in FIG. 8. A slightly different insert attachment means is used in which the tabs are replaced by radially projecting bifurcate members 92 which engage a rib 50 between the furcations. Again, upwardly extending wafer support structure 124 is provided, and may be nubs for point contact or ribs for line contact. These inserts may be attached to sequential pairs of ribs allowing a wafer to be supported in each slot of the carrier, or in alternate slots allowing more clearance for access to the wafer with a robotic wafer handling tool.

Those of skill in the art will recognize that although an H-Bar wafer carrier is described above as receiving the inserts, other carriers, such as transport modules as illustrated in U.S. Pat. Nos. 5,915,562 and 5,944,194, which are incorporated herein by reference, may also be used and are within the scope of the invention.

Although the description above contains many specificities, these should not be construed as limiting the scope of the invention but as merely providing illustrations of some of the presently preferred embodiments of the invention. Thus, the scope of the invention should be determined by the appended claims and their legal equivalents, rather than by the examples given.

What is claimed is:

1. A wafer carrier and insert for supporting at least one thin wafer therein, comprising:
    a carrier portion having at least a top, a bottom, a pair of opposing sides, and an open front, the pair of opposing sides having a plurality of opposing ribs defining a plurality of slots; and
    an insert, said insert being adapted to fit in one of said plurality of slots and comprising a plate, the plate having a pair of opposing side margins, each of the side margins having a plurality of tab structures adapted to friction ally engage said one of said plurality of slots, the plate further having a plurality of upwardly projecting wafer supports, the wafer supports being adapted to support a thin wafer above said insert with a portion of the periphery of the wafer within a separate one of said plurality of slots, said wafer supports disposed so that a robotic wafer handling member is insert able between said insert and the wafer.

2. The wafer carrier and insert of claim 1, wherein said insert has a bottom surface, and wherein said bottom surface has a plurality of stiffening ribs formed therein.

3. The wafer carrier and insert of claim 1, wherein each of said plurality of tab structures is biased against a surface of one of said plurality of opposing ribs, the direction of the bias of each tab structure being opposite the direction of bias of the immediately adjacent tab structures.

4. The wafer carrier and insert of claim 1, wherein the thin wafer is supported within a slot of said plurality of slots immediately adjacent the slot engaged by said insert, and wherein each of said plurality of upwardly projecting wafer supports projects into said immediately adjacent slot for a distance of at least half of the height of said immediately adjacent slot.

5. A wafer carrier and insert for supporting at least one thin wafer therein, comprising:
    a carrier portion having at least a top, a bottom, a pair of opposing sides, and an open front, the pair of opposing sides having a plurality of opposing ribs defining a plurality of opposing recesses and forming a plurality of slots; and
    a generally planar insert having a top surface, said insert comprising a plate with a pair of opposing margins, each margin having a plurality of structures for frictionally engaging one of said pair of opposing sides so that the plate is supported intermediate said pair of opposing sides, wherein said each said plurality of structures includes a plurality of radially projecting bifurcate members, and wherein each of said bifurcate members is adapted to engage one of said plurality of opposing ribs between the furcations of each bifurcate member, the plate further having means for supporting a thin wafer above said top surface, said means for supporting a thin wafer adapted so as to allow a robotic wafer handling member to be interposed between said insert and the thin wafer.

6. The wafer carrier and insert of claim 5, wherein said means for supporting a thin wafer above the top surface of said insert comprises a plurality of upwardly projecting wafer supports extending from said top surface.

7. The wafer carrier and insert of claim 5, wherein said insert has a bottom surface, and wherein said bottom surface has a plurality of stiffening ribs formed therein.

8. The wafer carrier and insert of claim 5, wherein a thin wafer supported by the insert is supported within a slot of said plurality of slots immediately adjacent the slot in which said insert is positioned, wherein said means for supporting a thin wafer above the top surface of said insert comprises a plurality of upwardly projecting wafer supports extending from said top surface, wherein each slot has a height, and wherein each of said plurality of upwardly projecting wafer supports projects into said immediately adjacent slot for a distance of at least half of the height of said immediately adjacent slot.

9. A method for supporting at least one thin wafer in a wafer carrier, comprising the steps of:

providing a wafer carrier having at least a top, a bottom, a pair of opposing sides, and an open front, the pair of opposing sides having a plurality of opposing recesses defining a plurality of slots;

forming a generally planar insert having a top surface and a pair of opposing margins, said insert being adapted to fit in one of said plurality of slots, each margin having a plurality of structures for frictionally engaging one of said opposing recesses, said insert having wafer supports for supporting a thin wafer with minimal contact above said top surface with a portion of the periphery of the wafer within a separate one of said plurality of slots;

placing said insert in one of said plurality of slots; and resting a thin wafer on the wafer supports of said insert.

10. A wafer carrier and insert for supporting at least one thin wafer therein, comprising:

a carrier portion having at least a top, a bottom, a pair of opposing sides, and an open front, the pair of opposing sides having a plurality of opposing recesses defining a plurality of slots; and a generally planar insert having a top surface, said insert being adapted to be fittable intermediate said pair of opposing sides and having a plurality of structures for frictionally engaging one of said plurality of slots so that said insert is supported by said sides, wherein said plurality of structures comprises a plurality of tab structures, each of said plurality of tab structures biased against a surface within said one of said plurality of opposing recesses, the direction of the bias of each tab structure being opposite the direction of bias of the immediately adjacent tab structures, said insert further having a plurality of upwardly directed wafer supports for supporting a thin wafer, said wafer supports disposed so as to allow a robotic wafer handling member to be interposed between said insert and the thin wafer.

11. The wafer carrier and insert of claim 10, wherein said insert has a bottom surface, and wherein said bottom surface has a plurality of stiffening ribs formed therein.

* * * * *

UNITED STATES PATENT AND TRADEMARK OFFICE
CERTIFICATE OF CORRECTION

PATENT NO. : 7,219,802 B2
APPLICATION NO. : 10/478587
DATED : May 22, 2007
INVENTOR(S) : Brian Wiseman, Michael Peterson and Tony Simpson It is certified that error appears in the above-identified patent and that said Letters Patent is hereby corrected as shown below:

Column 1, line 54, please replace "then" with --thin--
Column 1, line 61, please replace "into" with --to--
Column 5, line 30, please replace "25" with --25--
Column 6, line 12, please replace "friction ally" with --frictionally--
Column 6, line 19, please replace "insert able" with --insertable--

Signed and Sealed this

Twenty-ninth Day of July, 2008

JON W. DUDAS
*Director of the United States Patent and Trademark Office*